(12) United States Patent
Wilson

(10) Patent No.: US 7,956,694 B1
(45) Date of Patent: Jun. 7, 2011

(54) PHASE CONTROLLED DIMMER USING A NARROW BAND QUADRATURE DEMODULATOR

(76) Inventor: Jeffrey D. Wilson, River Vale, NJ (US)

( * ) Notice: Subject to any disclaimer, the term of this patent is extended or adjusted under 35 U.S.C. 154(b) by 589 days.

(21) Appl. No.: 12/119,032

(22) Filed: May 12, 2008

(51) Int. Cl.
*H03L 7/10* (2006.01)

(52) U.S. Cl. ............................ 331/12; 329/308; 315/194

(58) Field of Classification Search .................. 329/308; 331/12; 315/194
See application file for complete search history.

(56) References Cited

U.S. PATENT DOCUMENTS

| | | | |
|---|---|---|---|
| 4,238,739 A * | 12/1980 | Mosley et al. ................. | 331/12 |
| 4,336,500 A * | 6/1982 | Attwood ....................... | 329/308 |
| 4,797,599 A | 1/1989 | Ference | |
| 5,065,107 A * | 11/1991 | Kumar et al. ................. | 329/308 |
| 5,315,270 A * | 5/1994 | Leonowich ................... | 331/1 A |
| 5,430,356 A | 7/1995 | Ference | |
| 6,091,205 A | 7/2000 | Newman | |
| 6,380,692 B1 | 4/2002 | Newman | |
| 7,019,469 B1 | 3/2006 | Thurk | |

* cited by examiner

*Primary Examiner* — Joseph Chang
(74) *Attorney, Agent, or Firm* — Crestron Electronics Inc.

(57) ABSTRACT

A modified Costas control loop (80) using switched analog low pass filters (R2, C1, C2) (R3, C3, C4) and rectangular to polar conversion (341) computes an angular phase reference error that is processed by a digital loop filter (342) to control a counter (441) and a state machine (442) that are used to control the gating of a controllably conductive circuit (84) interposed between an AC source (81) and a phase-controlled load (83) such as a dimmable lamp.

32 Claims, 11 Drawing Sheets

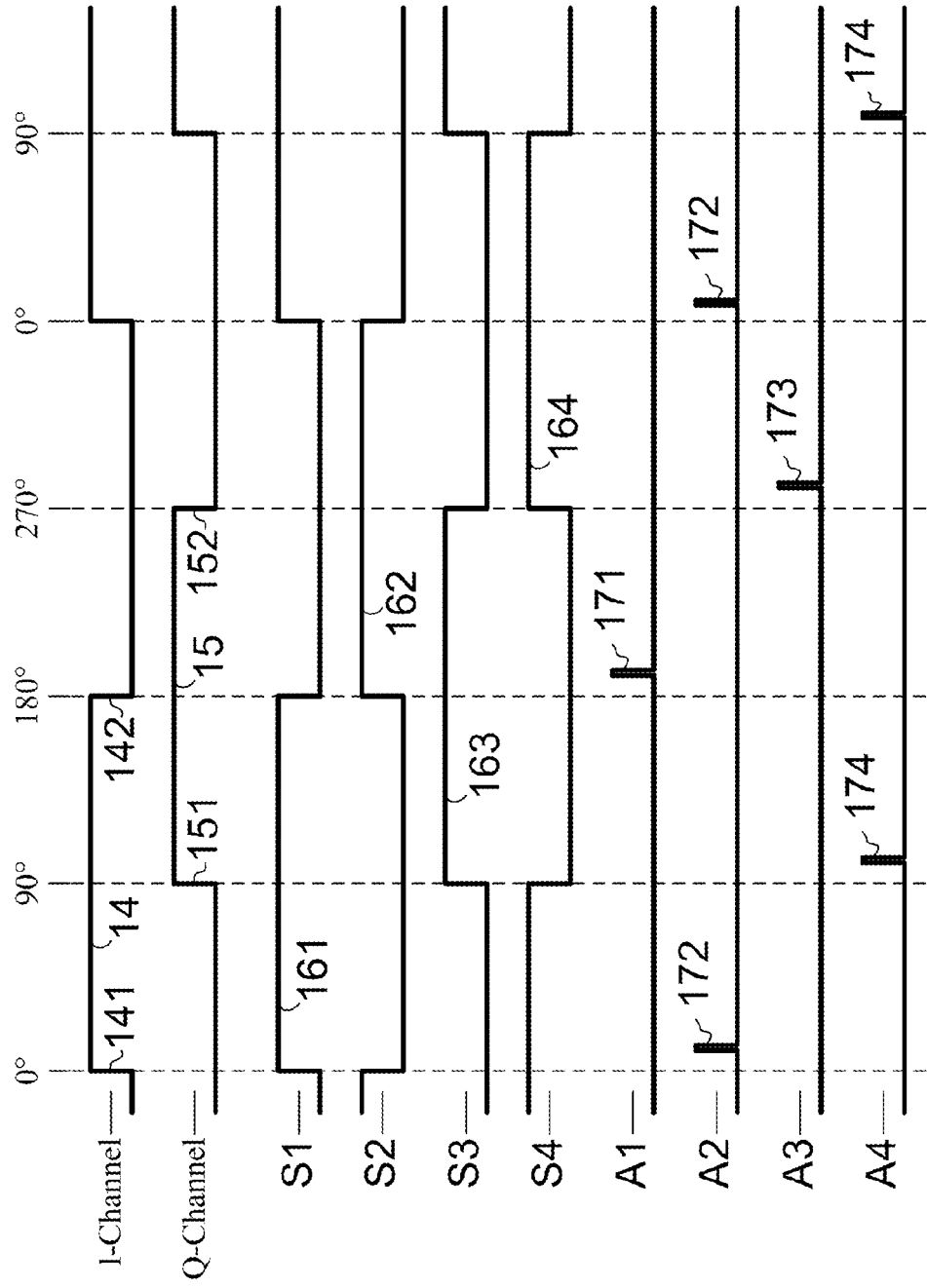

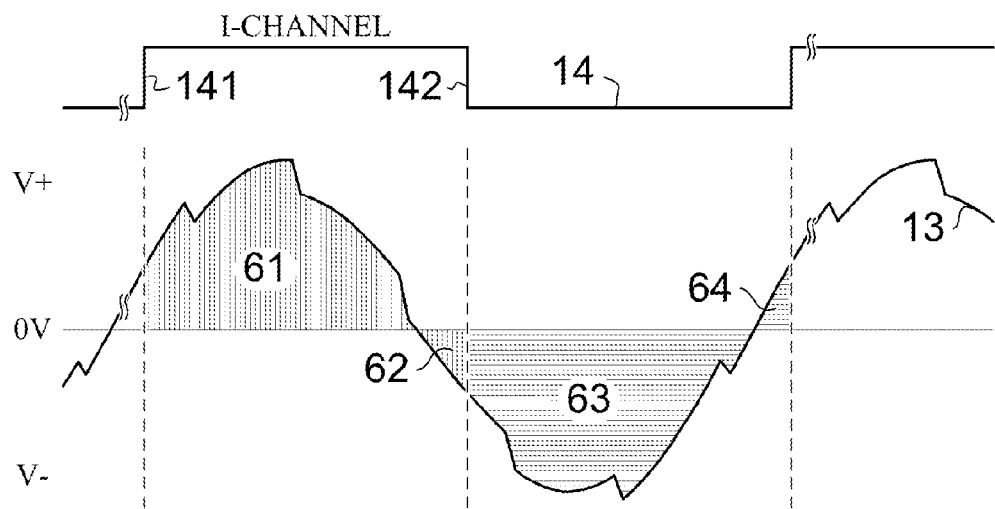
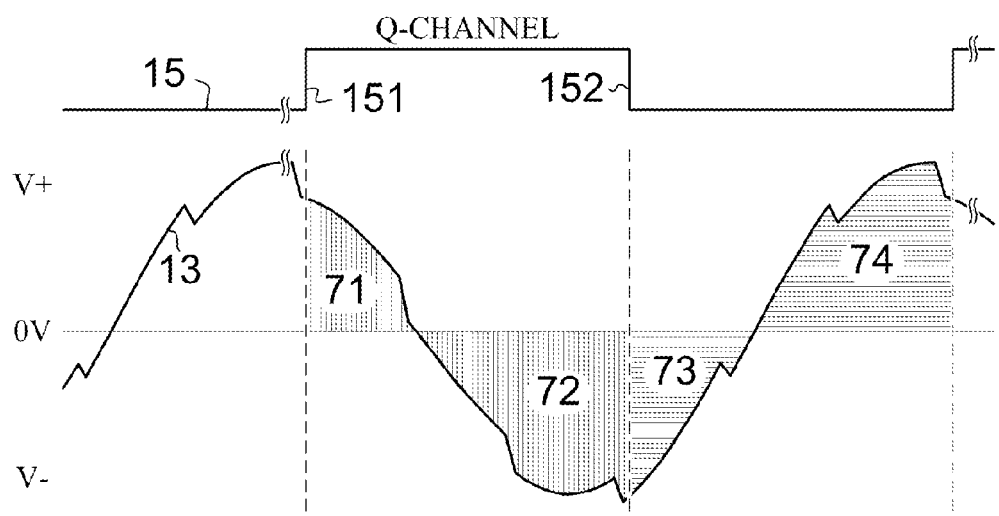

PHASE CONTROLLED DIMMER USING A NARROW BAND QUADRATURE DEMODULATOR

BACKGROUND OF THE INVENTION

1. Technical Field

The present invention relates generally to electronic systems that employ a phase control technique to control the amount of power delivered from an AC line source to a load. The present invention more specifically relates to using a modified Costas loop that incorporates rectangular to polar conversion in its feedback leg to recover the fundamental frequency phase information of an AC power line without detecting a zero crossing.

2. Background Art

Lighting control systems typically perform a dimming function by altering the conduction angle of a switchable conductive device, such as a metal oxide field effect transistor (MOSFET), by delivering a signal to a gate of the MOSFET such that the timing of the signal varies with the selected dimming level.

FIG. 1 shows an alternating current (AC) fundamental 11 sinusoidal source voltage such as 60 Hz, 120 VAC as is commonly used in the United States. Those skilled in the art will recognize that such a sinusoidal source voltage includes positive peaks 113, negative peaks 114 and both positive trending zero crossings 111 and negative trending zero crossings 112. These zero crossings are typically used as timing references for controlling the conduction angle used by typical light dimming equipment.

In a typical forward phase control system, generation of a gate control signal is synchronized with the AC fundamental 11 such that, sometime after a zero crossing of the AC line voltage is detected, the gate control signal is generated, the gate of the switchable conductive device is energized, and the device conducts for the remainder of the AC half cycle. During the time interval between the detection of the zero crossing and the generation of the gate control signal, no power is delivered from the AC source to the load (i.e. the device is non-conducting). The conducting and non-conducting time intervals are altered in response to a dimming command. Ference (U.S. Pat. No. 5,430,356) provides a description of such programmable lighting control that includes normalized dimming for different light sources.

Also shown in FIG. 1 is a noise 12 signal represented by an out of phase sawtooth wave at a third harmonic (e.g. 180 Hz) of AC fundamental 11. When the noise 12 is overlaid on the AC fundamental 11, a representative noisy AC line 13 signal is formed. The noise 12 shown may be representative of certain interfering signals encountered in 'real-world' lighting applications.

Prior art has detected noisy AC line zero crossings 131 using a phase lock loop (PLL) to reduce the jitter caused by interfering signals, such as noise 12. Newman (U.S. Pat. No. 6,091,205) teaches the use of a Bessel low-pass filter before a zero crossing detector, but disadvantageously relies on either factory calibration or analysis of a lightly filtered version of the AC line to compensate for the phase delay introduced by its Bessel low-pass filter. Those skilled in the art will recognize that relying on factory calibration will render the equipment susceptible to errors due to component drift over time, errors due to operational temperature variations, and increased production cost during manufacture. Also since the Newman method relies on monitoring a 'lightly filtered' zero cross, such factory calibration may prove to be of little value if the AC line was noisy at the time when that calibration was performed.

Newman also discloses several other filters that may be used to filter the incoming signal, including a Butterworth filter, and a Chebyshev filter. According to Newman, after the incoming signal is filtered, it is then passed to a zero-crossing detector to start the timing sequence typically used in a phase control dimmer.

In the unrelated field of telecommunications, a Costas loop is a phase-locked loop used for carrier phase recovery from suppressed-carrier modulation signals, such as from double-sideband suppressed carrier signals. The Costas loop includes a 'quadrature demodulator', a type of circuit which forms the front end of almost all modern narrow-band radio frequency (RF) receivers from cell-phones to digital cable boxes.

FIG. 2 shows a typical prior art implementation of a Costas loop 20 that involves two parallel tracking loops operating simultaneously from the same reference oscillator 243. The first tracking loop, consists of an in-phase leg (I-leg) and a common feedback leg and operates as phase locked loop (PLL) based on an in-phase (e.g. phase shift=0°) modulation signal from the reference oscillator 243. The second tracking loop, consists of a quadrature leg (Q-leg) and the common feedback leg and operates as phase locked loop (PLL) based on a quadrature (e.g. phase shift=90°) modulation signal from the reference oscillator 243. The quadrature modulation signal is typically produced by passing the reference oscillator output through a 90° phase shift device 244

An I-leg product detector 221 accepts an input signal, such as an RF carrier 21, and the in-phase modulation signal and produces a multiplicative I-leg product signal. The I-leg product signal is passed through an I-leg low pass filter 222 and the resultant filtered product is the I-leg output I(t) signal 225 that is applied to a feedback leg phase detector 241.

A Q-leg product detector 231 accepts the RF carrier 21 and the quadrature modulation and produces a multiplicative Q-leg product signal. The ( ) leg product signal is passed through a Q-leg low pass filter 232 and the resultant filtered product is the Q-leg output Q(t) signal 235 that is applied to the feedback leg phase detector 241.

The feedback leg phase detector 241 multiplies the I-leg output I(t) signal 225 with Q-leg output Q(t) signal 235 and the resultant loop error product signal is passed through a loop filter 242 and then used to modify the output frequency of the reference oscillator 243. The loop error signal should settle to a fixed value when the loop is locked. A negative loop error typically results in a lower reference oscillator 243 frequency, and similarly, a positive loop error typically results in a higher reference oscillator 243 frequency. The low pass filters in each leg must be wide enough to pass the desired modulation, such as data modulation, without distortion.

Some key aspects of a quadrature demodulator, such as a Costas loop 20, are that bandwidth is twice the corner frequency of the low-pass filters 222 and 232, the center frequency of the filter is determined by the reference oscillator 243 frequency, and all spectral information in the band passed by the Costas loop 20 (e.g. filter) is contained in the I(t) and Q(t) outputs 225 and 235.

In the field of lighting control, the prior art has attempted to detect zero crossings by either operating upon a separately generated signal that is intended to replicate both the phase and frequency of the fundamental of the AC line, or by operating upon the AC line itself. Unfortunately, merely quantifying an AC line with a zero crossing comparator throws away useful signal information.

For light dimming applications, the frequency of the AC line is not known exactly, but can be assumed to be within a range of a few Hz from the applicable national standard (i.e. 50 or 60 Hz). In practice, most national power grids are extremely accurate although backup power generators are not. The Costas loop, such as that shown in FIG. 2 is not suitable for recovering phase information from a noisy AC line because the output amplitude of the multiplier feeding the loop filter is highly dependent on the amplitude of the incoming AC signal. If a modified Costas loop is to be adapted for light dimming applications, then some means is needed to adjust the frequency of the reference oscillator to make it track the AC power line.

To solve the aforementioned problems, the present invention is a unique apparatus that synthesizes square waves that are substantially in phase and in quadrature with an AC source where the parameters used to synthesize the square waves are also used to control the conduction angle of the load.

SUMMARY OF THE INVENTION

The following summary of the invention is provided to facilitate an understanding of some of the innovative features unique to the present invention. A full appreciation of the various aspects of the invention can only be gained by taking the entire specification, claims, drawings, and abstract as a whole.

The present invention is a phase controlled dimmer that synchronizes to an AC line by using analog phase detection both in phase and in quadrature. The inventor has noted that when a synthesized waveform such as in a phase locked loop (PLL) is being generated using control signals, it is advantageous to use these signals to control the gate of the switchable conductive device without relying on a zero crossing detector. Advantageously, this resolves any ambiguity about the relationship between the AC line and the reference clock and accordingly PLL 'lock time' becomes rapid and predictable. Such means of analog phase detection will be recognized by those skilled in art as being similar to "lock in" amplifiers commonly used in analytical instrumentation.

An even further advantage of using phase detectors in quadrature is that the both phase and line voltage are measurable independently of each other and accordingly, the recovered voltage measurement may be used for voltage compensation in a further embodiment of the present invention.

According to a first aspect, the present invention provides a system for recovering the phase and amplitude of an AC power line signal that includes a phase detector having an output linearly proportional to phase error and independent of line voltage, a digital loop filter, and a controllable digital oscillator that produces in phase and quadrature reference signals. The phase detector further includes a quadrature demodulator, an I-leg low pass filter, a Q-leg low pass filter, and a rectangular to polar converter. The quadrature demodulator uses the in phase and quadrature reference signals produced by the controllable digital oscillator. The quadrature demodulator, the I-leg low pass filter, and the Q-leg low pass filters are each implemented as analog elements. The rectangular to polar converter, the digital loop filter, and the controllable oscillator are each realized as functions of a programmable microcontroller.

According to a second aspect, the present invention provides a system for recovering the phase and amplitude of an AC power line signal including a phase detector having an output linearly proportional to phase error and independent of line voltage, a digital loop filter, a counter, and a state machine that produces in phase and quadrature control signals. The phase detector further includes an I-leg mixer implemented using a first analog switch, an I-leg positive low pass filter, an I-leg negative low pass filter, a Q-leg mixer implemented using a first analog switch, a Q-leg positive low pass filter, a Q-leg negative low pass filter, and a rectangular to polar converter. The rectangular to polar converter accepts the computed difference between the I-leg positive low pass filter output and the I-leg negative low pass filter output, and the computed difference between the Q-leg positive low pass filter output and the Q-leg negative low pass filter output. Outputs from the state machine drive the I-leg and Q-leg analog switches.

According to a third aspect, the present invention provides a load control system for controlling power delivered from an AC line to a load, wherein the AC line has a fundamental frequency. This load control system comprises a control circuit including a controllably conductive device, conduction angle control logic, in-phase and quadrature channel signals, in-phase positive and negative side capacitors, quadrature positive and negative side capacitors, a rectangular to polar converter, and a digital loop filter. The conduction angle control logic produces a control signal, to the control circuit, in response to a selected dimming level, an internal clock, and a modulus. The two state in-phase channel signal is produced in response to the internal clock and has substantially the same frequency as and is substantially in phase with the fundamental frequency. The two state quadrature channel signal is produced in response to the internal clock and has substantially the same frequency. The in-phase positive side capacitor functions as part of a low pass filter during a first state of the in-phase channel signal and is analog to digital converted to a first in-phase value during a second state of the in-phase channel signal. The in-phase negative side capacitor functions as part of the low pass filter during a second state of the in-phase channel signal and is analog to digital converted to a second in-phase value during a first state of the in-phase channel signal. The quadrature positive side capacitor functions as part of a low pass filter during a first state of the quadrature channel signal and is analog to digital converted to a first quadrature value during a second state of the quadrature channel signal. The quadrature negative side capacitor functions as part of the low pass filter during a second state of the quadrature channel signal and is analog to digital converted to a second quadrature value during a first state of the quadrature channel signal. The rectangular to polar converter accepts the difference of the first and second in-phase values as a first rectangular (x) coordinate and the difference of the first and second quadrature values as a second rectangular (y) coordinate and computes a polar angular ($\theta$) coordinate. The digital loop filter accepts the polar angular ($\theta$) coordinate and modifies the modulus.

According to a fourth aspect, the present invention provides a dimmer for controlling power delivered from an AC line to a load where the AC line has a fundamental frequency The dimmer comprises a control circuit including a controllably conductive device, analog phase detector circuitry, and a microcontroller configured to execute a programmed sequence of instructions. The analog phase detector circuitry further comprises a shared I-leg resistor, an I-leg analog switch, a shared Q-leg resistor, and a Q-leg analog switch. The I-leg analog switch determines when the shared I-leg resistor is forming part of a first I-leg RC filter in combination with a first I-leg capacitor or when the shared I-leg resistor is forming part of a second I-leg RC filter in combination with a second I-leg capacitor. The Q-leg analog switch determines when the shared Q-leg resistor is forming part of a first Q-leg RC filter in combination with a first Q-leg capacitor or when the shared Q-leg resistor is forming part of a second Q-leg RC filter in combination with a second Q-leg capacitor. The microcontroller instructions include a rectangular to polar converter module that accepts the difference of the first and second I-leg RC filters as a first rectangular (x) coordinate and the difference of the first and second Q-leg RC filters as a second rectangular (y) coordinate and computes a polar angular (θ) coordinate. The microcontroller instructions also include a digital loop filter module that accepts the polar angular (θ) coordinate computes a modulus. The microcontroller instructions also include a counter module that increments in response to an internal clock, accepts the modulus, and produces a count signal. The microcontroller instructions also include a state machine module that accepts the count signal and produces multiple I-leg and Q-leg control signals. The microcontroller instructions also include a conduction angle control logic module that accepts the count signal produces a control signal to the controllably conductive device.

According to a fifth aspect, the present invention provides a method for controlling power delivered from an AC line having a fundamental frequency to a load through a serially connected controllably conductive device. This method includes the steps of: (1) quadrature demodulating the noisy AC line, (2) producing in-phase and quadrature component signals, (3) computing an angular coordinate from these component signals using a rectangular-to-polar conversion, (4) closing a phase-locked-loop based on the angular coordinate by correcting an internal counter, and (5) controlling the power delivered by gating a controllably conductive device in response to the internal counter.

The present invention seeks to overcome or at least ameliorate one or more of several problems, including but not limited to: high levels of low frequency carrier current signals that, for example, may be common in parts of Europe.

BRIEF DESCRIPTION OF DRAWINGS

The accompanying figures further illustrate the present invention.

Figure 1:
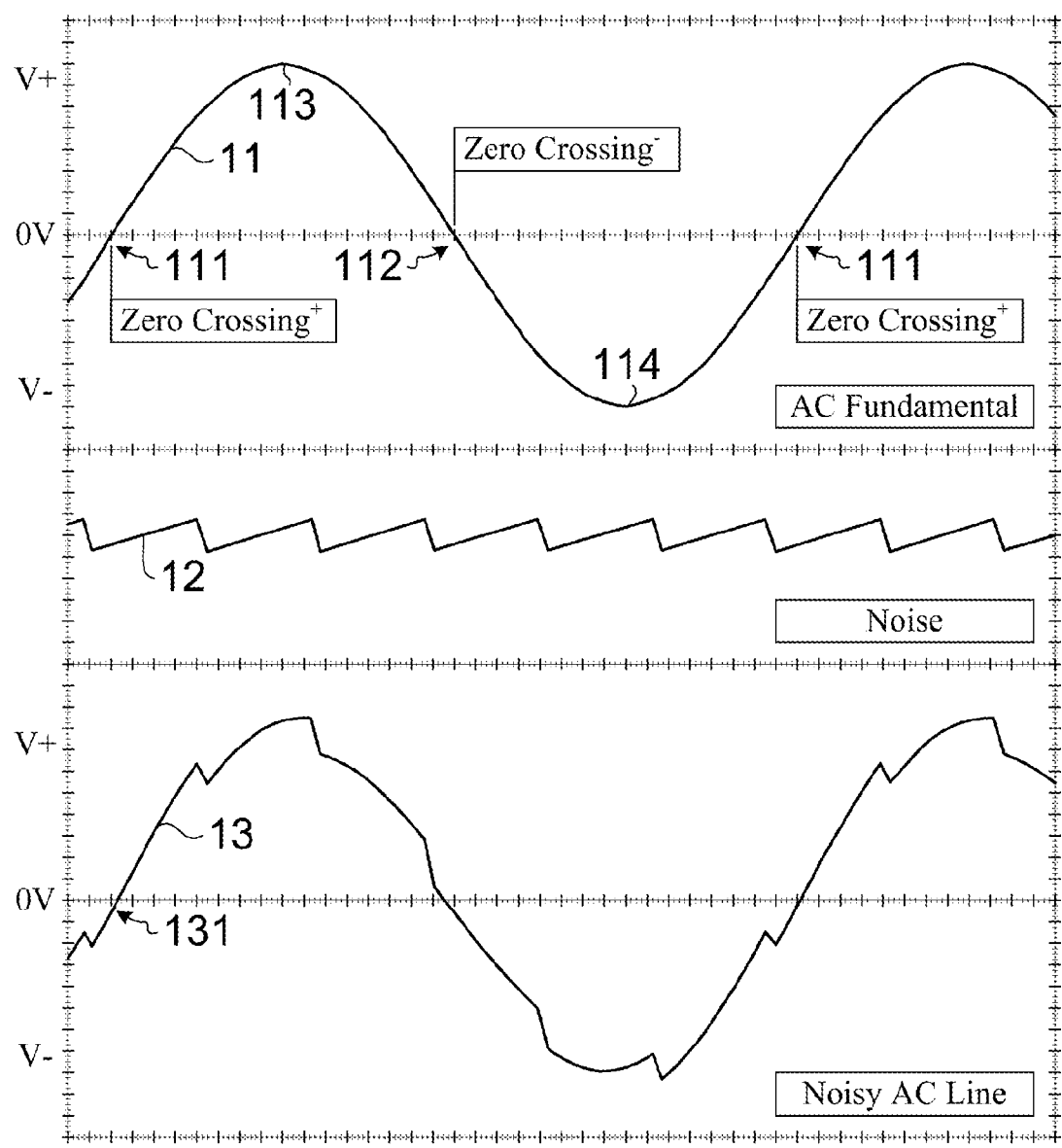

Brief Description of the Several Views of the Drawing

FIG. 1 is an exemplary plot illustrating a typical noisy AC line signal and its constituent elements including an AC fundamental.

Figure 2:
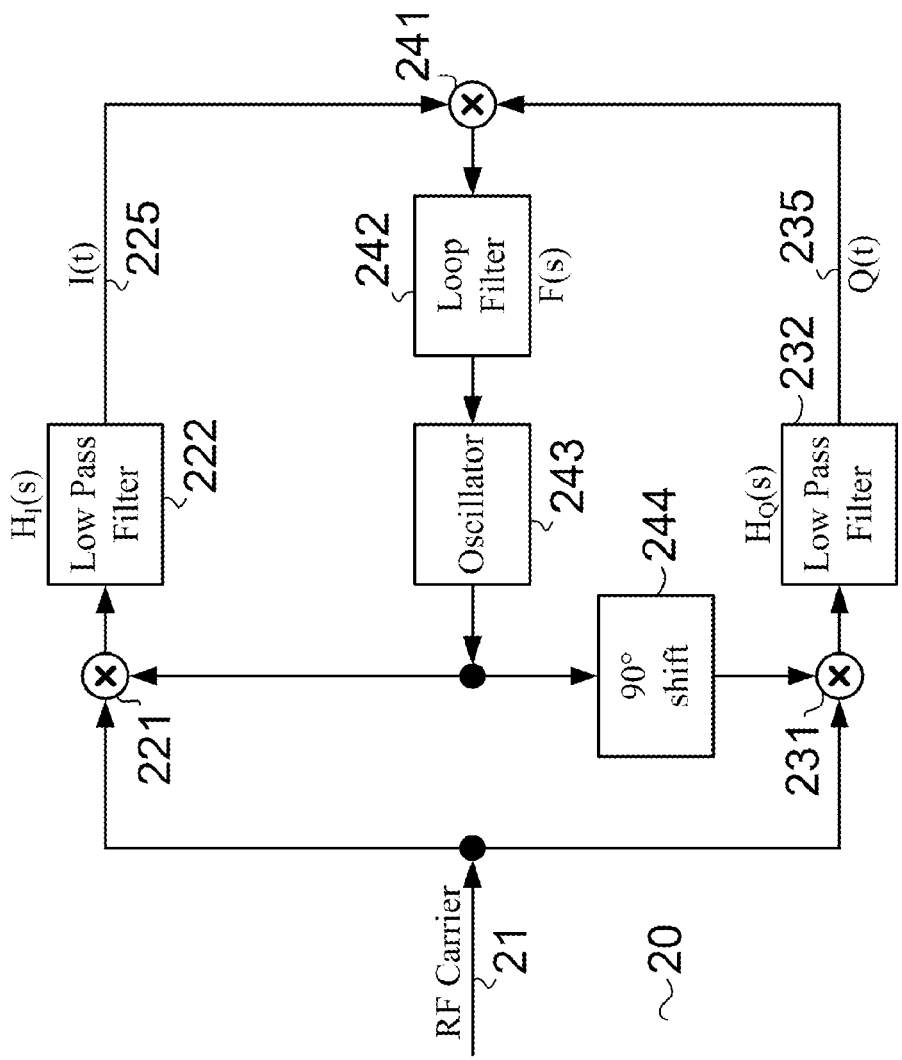

FIG. 2 illustrates a prior art Costas loop known in the field of telecommunications.

Figure 3:
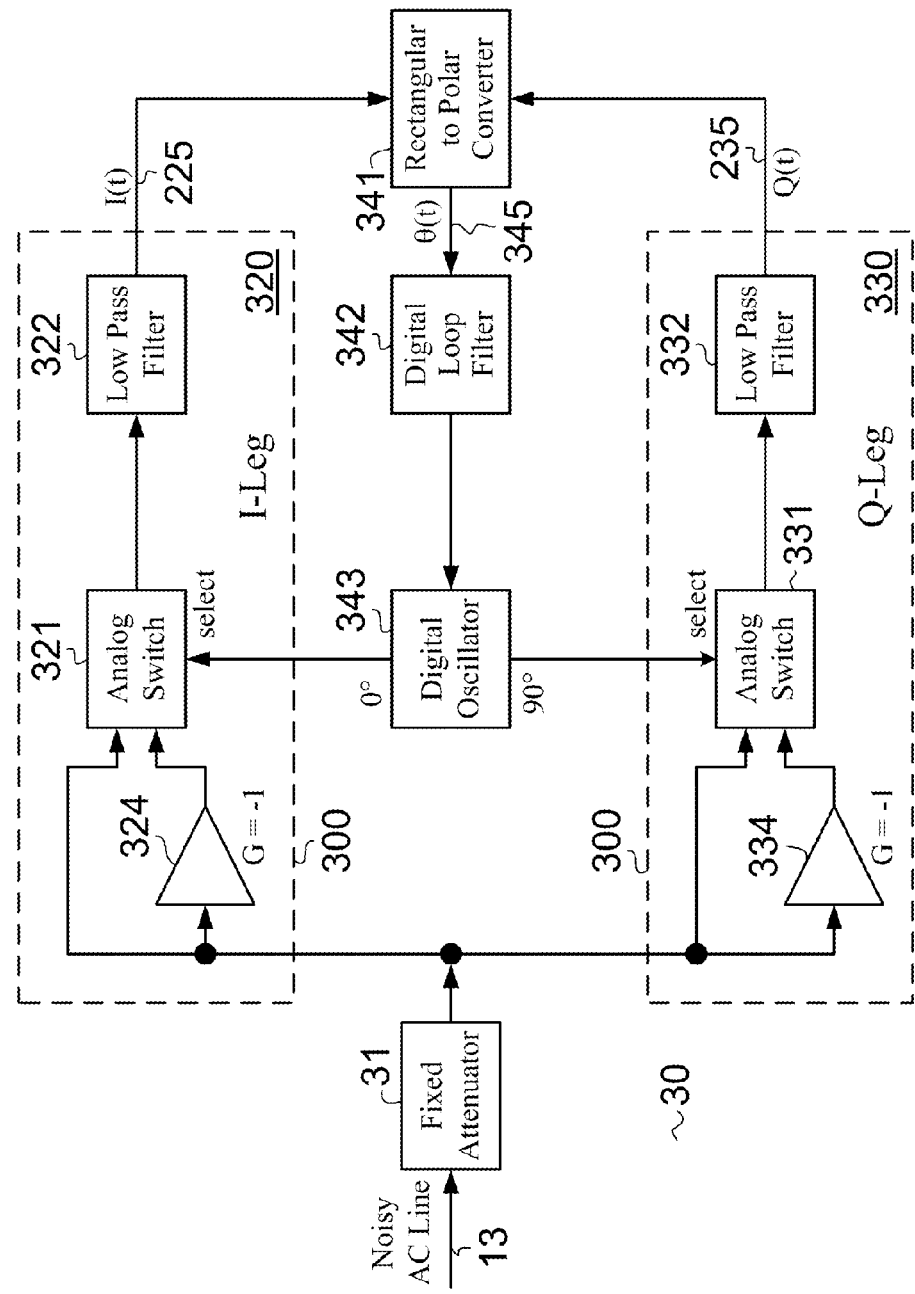

FIG. 3 depicts an illustrative 'Wilson filter' control loop that includes switched inverting unity gain amplifiers in accordance with a first embodiment of the present invention.

Figure 4:
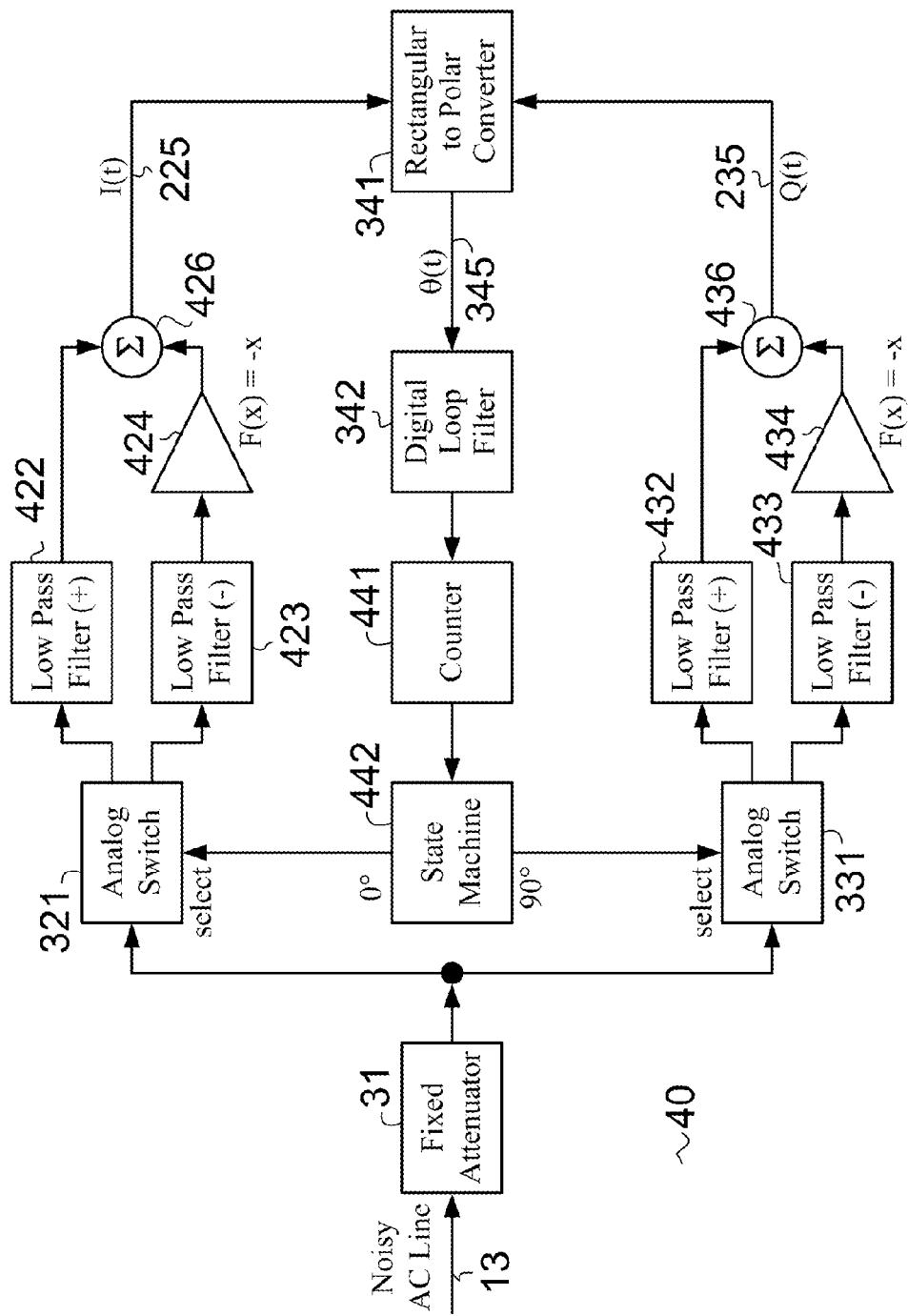

FIG. 4 depicts an illustrative 'Wilson filter' control loop that includes switched analog low pass filters in accordance with a second embodiment of the present invention.

Figure 5:
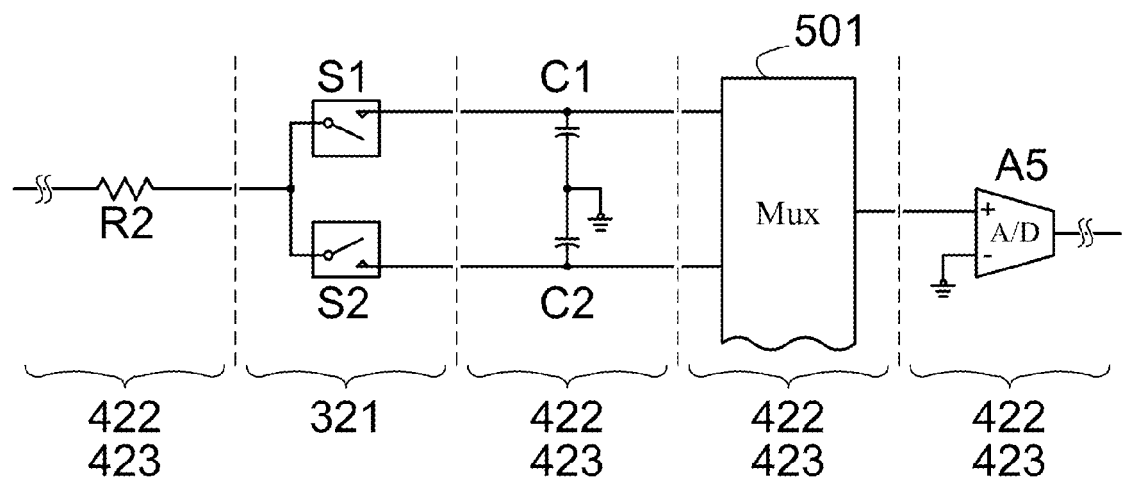

FIG. 5 depicts an illustrative fixed attenuator configuration suitable for use with certain embodiments of the Wilson filter shown in FIG. 3.

Figure 6:
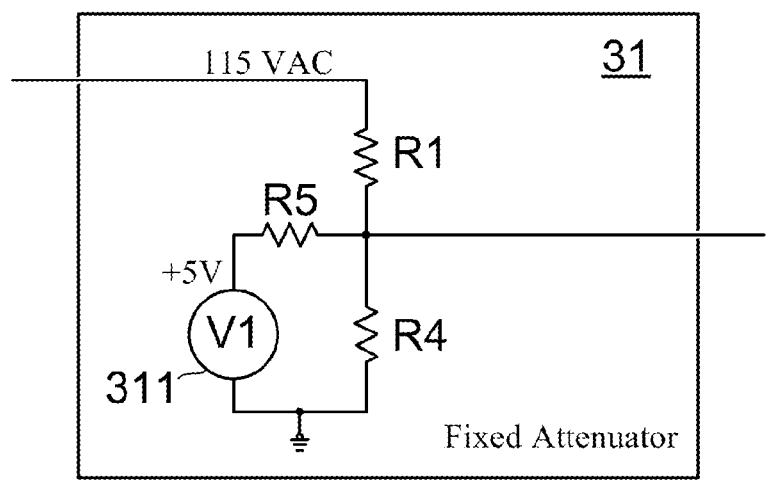

FIG. 6 depicts an illustrative analog switch and dual low pass filter configuration suitable for use with certain embodiments of the Wilson filter shown in FIG. 5.

Figure 7:
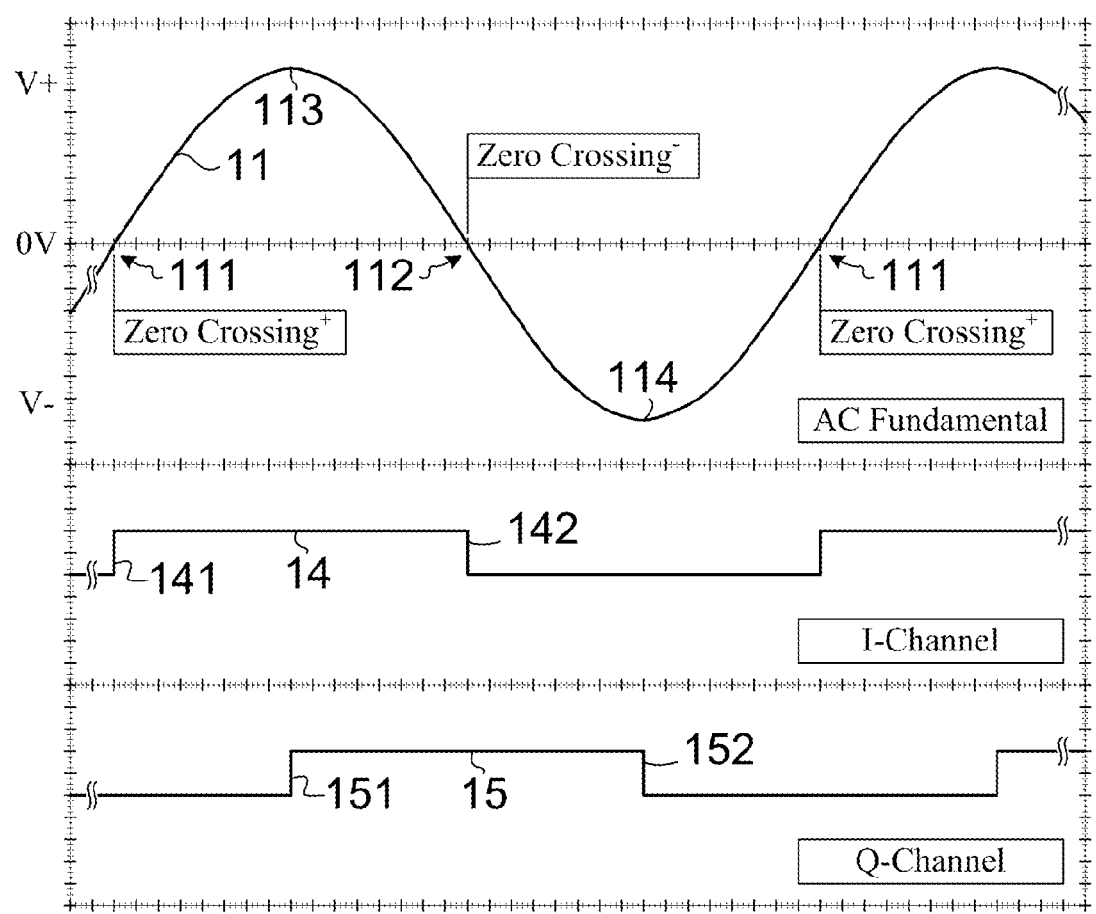

FIG. 7 illustrates timing associated with certain signals of the present invention with respect to the AC fundamental.

Figure 8:
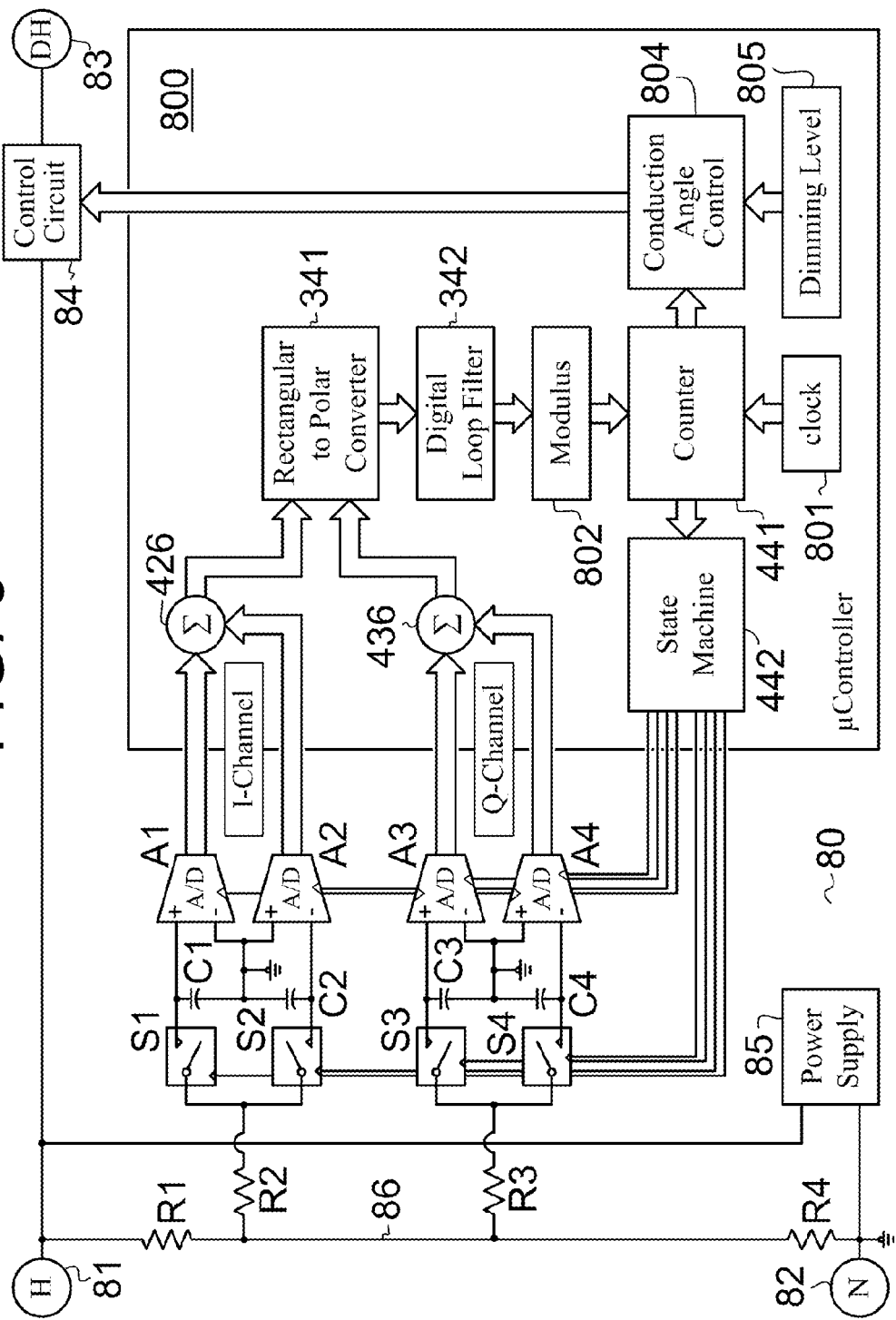

FIG. 8 schematically shows a block diagram of an illustrative embodiment of the present invention.

FIG. 9 depicts a timing diagram showing for control signals useful for the illustrative embodiment of FIG. 8.

FIG. 10 illustrates the area under the noisy AC line signal of FIG. 1 as selected by a phase shifted I-channel signal of the present invention.

FIG. 11 illustrates the area under the noisy AC line signal of FIG. 1 as selected by a phase shifted Q-channel signal of the present invention.

Figure 12:
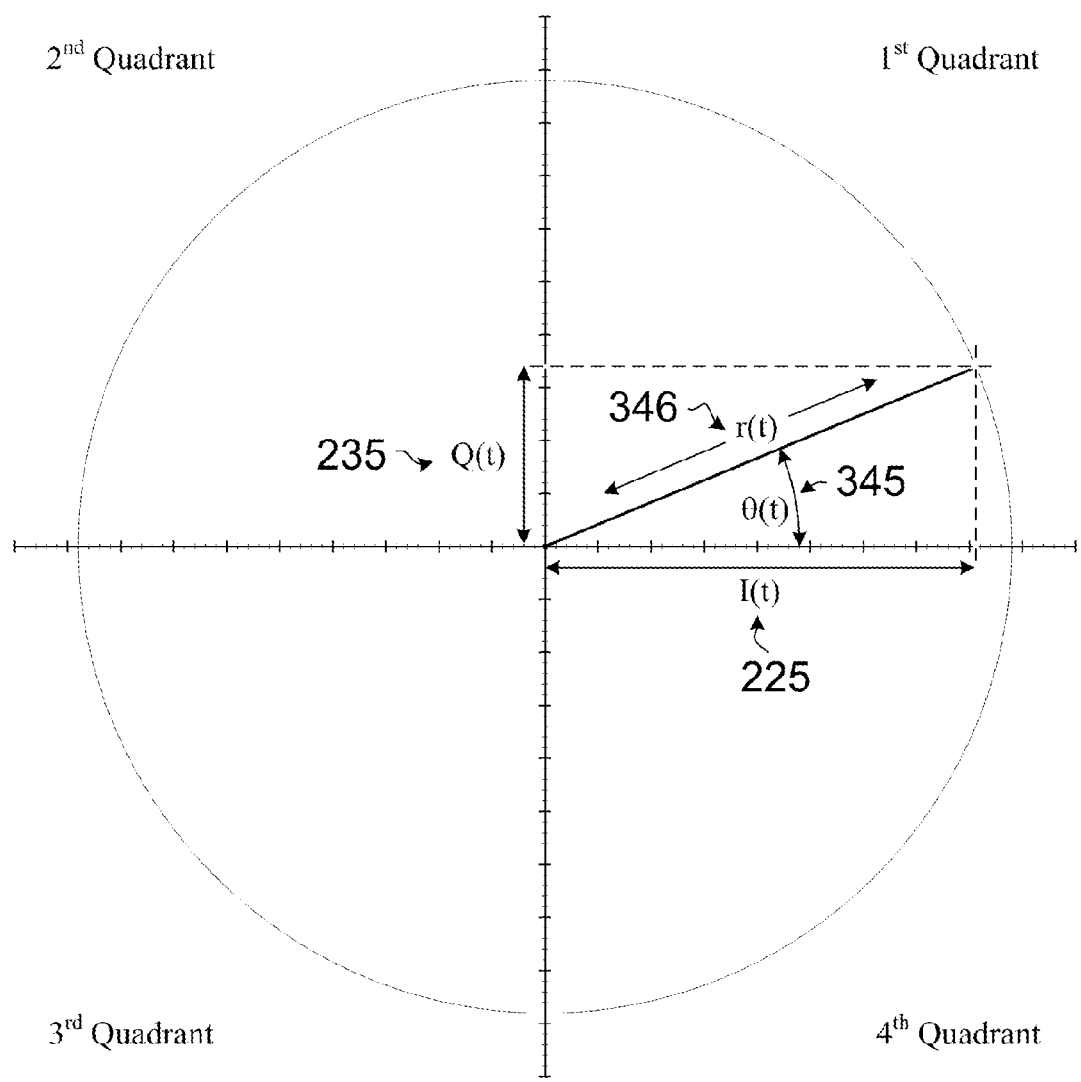

FIG. 12 illustrates a polar to rectangular conversion of the areas shown in FIGS. 10 and 11 in accordance with an embodiment of the present invention.

Figure 13:
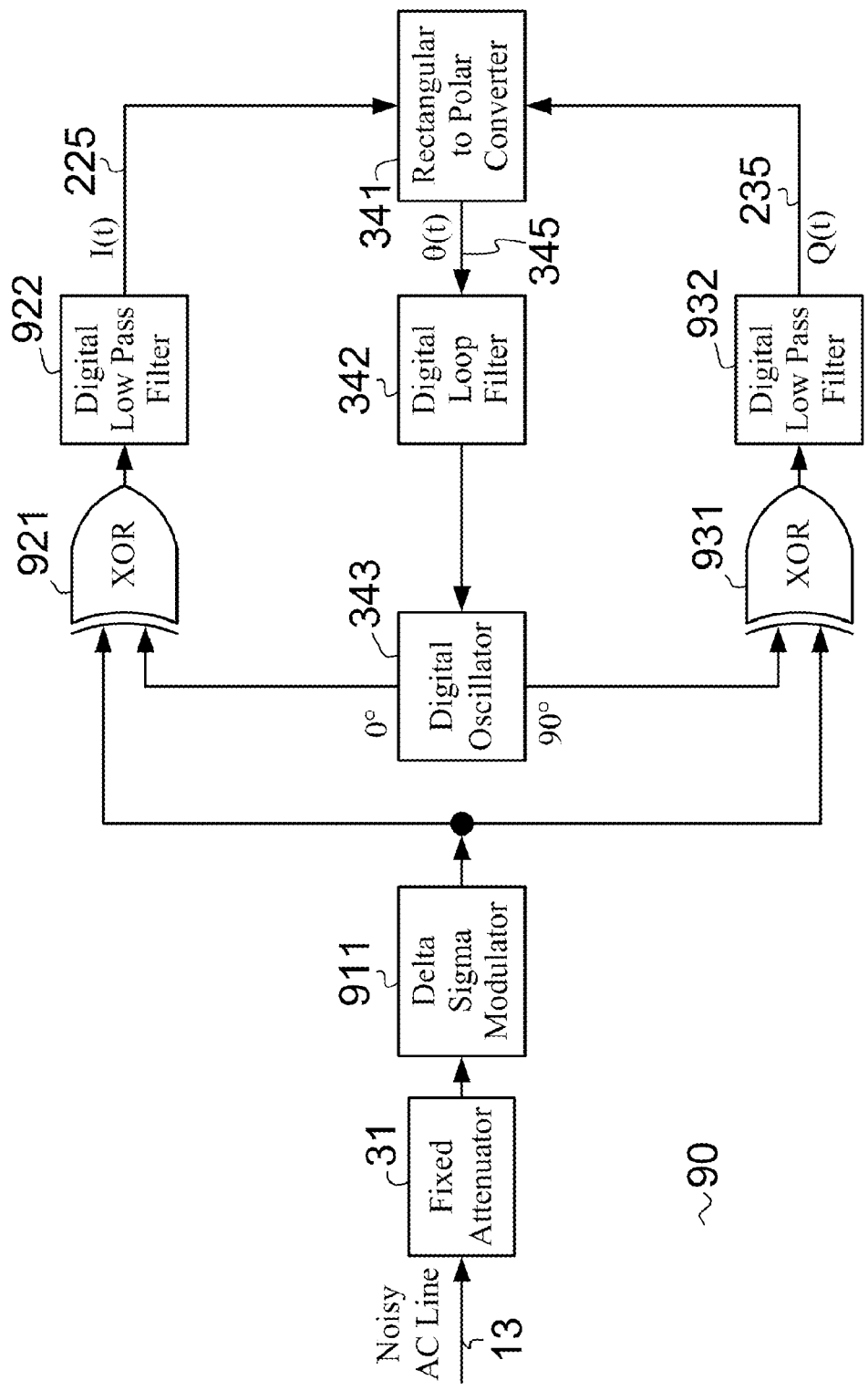

FIG. 13 depicts an illustrative 'Wilson filter' control loop that includes a delta sigma modulator in accordance with a third embodiment of the present invention.

LIST OF REFERENCE NUMBERS FOR THE MAJOR ELEMENTS IN THE DRAWING

The following is a list of the major elements in the drawings in numerical order.
11 AC fundamental
12 noise signal (additive to AC fundamental 11)
13 noisy AC line signal
14 I-channel square wave (in phase with AC fundamental)
15 Q-channel square wave (in quadrature with AC fundamental)
20 Costas loop (prior art)
21 RF carrier (input to Costas loop 20)
30 Wilson Filter (first embodiment)
31 fixed attenuator
40 Wilson Filter (second embodiment)
61 first I-area (I-channel high, noisy AC positive)
62 second I-area (I-channel high, noisy AC negative)
63 third I-area (I-channel low, noisy AC negative)
64 fourth I-area (I-channel low, noisy AC positive)
80 three wire phase controlled lighting dimmer
81 AC hot input (H)
82 AC neutral input (N)
83 dimmer hot output (DH)
84 control circuit
85 DC power supply
86 junction point (between voltage divider resistors R1 and R4)
81 first Q-area (Q-channel high, noisy AC positive)
82 second Q-area (Q-channel high, noisy AC negative)
83 third Q-area (Q-channel low, noisy AC negative)
84 fourth Q-area (Q-channel low, noisy AC positive)
90 Wilson Filter (third embodiment)
111 positive trending zero crossing (of AC fundamental 11)
112 negative trending zero crossing (of AC fundamental 11)
113 positive peak (of AC fundamental 11)
114 negative peak (of AC fundamental 11)
131 positive trending zero crossing (of noisy AC line 13)
141 I-channel square wave rising edge
142 I-channel square wave falling edge
151 Q-channel square wave rising edge
152 Q-channel square wave falling edge
161 first control signal of state machine 442 (activates S1)
162 second control signal of state machine 442 (activates S2)
163 third control signal of state machine 442 (activates S3)
164 fourth control signal of state machine 442 (activates S4)
171 fifth control signal of state machine 442 ('reads' A1)
172 sixth control signal of state machine 442 ('reads' A2)
173 seventh control signal of state machine 442 ('reads' A3)
174 eighth control signal of state machine 442 ('reads' A4)

221 I-leg product detector (part of Costas loop 20)
222 I-leg low pass filter (part of Costas loop 20)
225 I-leg output signal I(t)
231 Q-leg product detector (part of Costas loop 20)
232 Q-leg low pass filter (part of Costas loop 20)
235 q-leg output signal Q(t)
241 feedback leg phase detector (part of Costas loop 20)
242 loop filter (part of Costas loop 20)
243 reference oscillator (part of Costas loop 20)
244 90-degree phase shift (part of Costas loop 20)
300 quadrature demodulator
311 DC offset voltage source (V1)
320 I-leg (part of quadrature demodulator 300)
321 analog switch (I-leg)
322 I-leg low pass filter (part of Wilson Filter 30)
324 inverting unity gain amplifier (I-leg)
330 Q-leg (part of quadrature demodulator 300)
331 analog switch (Q-leg)
332 Q-leg low pass filter (part of Wilson Filter 30)
334 inverting unity gain amplifier (Q-leg)
341 rectangular to polar converter
342 digital loop filter (feedback leg)
343 digital oscillator
345 angular coordinate θ(t) (phase angle error feedback))
346 magnitude coordinate r(t) (voltage measurement)
422 positive side low pass filter (I-leg)
423 negative side low pass filter (I-leg)
424 digital multiply-by-negative-one function (I-leg)
426 digital summation function (I-leg)
432 positive side low pass filter (Q-leg)
433 negative side low pass filter (Q-leg)
434 digital multiply-by-negative-one function (Q-leg)
436 digital summation function (Q-leg)
441 counter
442 state machine
501 multiplexer
800 microcontroller
802 modulus (function of microcontroller 800)
801 clock (function of microcontroller 800)
804 conduction angle control (function of microcontroller 800)
805 dimming level (function of microcontroller 800)
911 delta-sigma modulator
921 XOR gate (I-leg)
922 digital low pass filter (I-leg)
931 XOR gate (Q-leg)
932 digital low pass filter (I-leg)
A1 I-leg positive side analog to digital converter
A2 I-leg negative side analog to digital converter
A3 Q-leg positive side analog to digital converter
A4 Q-leg negative side analog to digital converter
A5 multiplexed analog to digital converter
C1 I-leg positive side capacitor (switched RC time constant with R2)
C2 I-leg negative side capacitor (switched RC time constant with R2)
C3 Q-leg positive side capacitor (switched RC time constant with R3)
C4 Q-leg negative side capacitor (switched RC time constant with R3)
R1 first voltage divider resistor
R2 shared I-leg resistor (RC time constant with C1 or C2)
R3 shared Q-leg resistor (RC time constant with C3 or C4)
R4 second voltage divider resistor
R5 third voltage divider resistor
S1 CMOS analog switch (I-leg positive side selector switch)
S2 CMOS analog switch (I-leg negative side selector switch)
S3 CMOS analog switch (Q-leg positive side selector switch)
S4 CMOS analog switch (Q-leg negative side selector switch)

DETAILED DESCRIPTION OF THE INVENTION

The present invention is a phase control system suitable for use as an AC circuit lighting dimmer.

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to".

MODE(S) FOR CARRYING OUT THE INVENTION

The preferred embodiment of the present invention is described herein in the context of a dimming system for a lighting load, but is not limited thereto, except as may be set forth expressly in the appended claims. The present invention has application to any AC controller that employs a phase control technique for control of load power, i.e., a system where a controllably conductive device is either turned on or off based for a period of time during each half wavelength (e.g. 180°) of the AC input power.

Additionally, the present invention is described herein in the context of a wall mountable dimmer switch, but has applicability to any dimming system, including, by way of example, dimming systems with panel mounted dimmers, and the present invention is directed to and encompasses all such systems. The implementation of the present invention in such applications and systems will be readily apparent to those skilled in the art from the following description.

The problem of recovering phase information from an AC power line using a phase locked loop can be addressed by using a feedback signal to the loop filter that is linearly proportional to the phase difference between the AC line and the reference oscillator, but is also independent of the line voltage. One intended application is for generation of a phase reference for phase-angle control of a switching device (such as TRIACs, SCR's, IGBT's, MOSFETS or similar) to regulate power delivered to a load (such as a lamp dimming system).

Refer first to FIG. 3 which shows a modified Costas loop that incorporates a rectangular to polar converter 341 in its feedback leg where the inventor's present employer has dubbed such a modified Costas loop as a 'Wilson Filter' 30. Those skilled in the art will recognize that it is desirable to embody such a rectangular to polar converter 341 as software instructions running, for example, on a microcontroller rather than attempting an analog circuitry implementation.

Now also consider the prior art FIG. 2. This first embodiment of the Wilson Filter 30, including switched inverting unity gain amplifiers is shown in FIG. 3. The signal of interest is now the noisy AC line 13, which is first scaled by fixed attenuator 31 to a voltage level, such as +/−2.5VDC, compatible with typical digital electronics circuitry. Within the I-leg 320, product detector 221 has been replaced with the combination of an analog switch 321 and an inverting unity gain amplifier 324. Within the Q-leg 330, the product detector 231 has been similarly replaced with the combination of an analog switch 331 and an inverting unity gain amplifier 334. Within the feedback leg, the phase detector 241 is replaced with a rectangular to polar converter 341, with the feedback signal now being an angular coordinate θ(t) 345 instead of a loop error product.

It is desirable to compute the rectangular to polar conversion in the digital realm, and therefore the feedback loop (analog) filter 242 is replaced with a digital loop filter 342 and the reference oscillator is replaced with a controllable digital oscillator 343 that natively provides both an in-phase (e.g. 0° phase shift) reference square wave and a quadrature (e.g. 90° phase shift) reference square wave. Because the digital loop filter 342 includes an integration term, the angular coordinate θ(t) feedback signal will be driven to zero, and the in-phase output of the digital oscillator 343 will be almost exactly synchronized with the AC fundamental 11 component. Practical design aspects of the low-pass filters 322 and 332 and design considerations with regard to how the signals are digitized, such as the sample and hold (S/H) aspect of the design, introduce a small, fixed, and predicable phase offset between the in-phase output signal 343 and the AC fundamental 11. This error can be, and is corrected mathematically.

Those skilled in the art will recognize that the combination of the I-leg inverting unity gain amplifier 324, I-leg analog switch 321, Q-leg inverting unity gain amplifier 334, and Q-leg analog switch 331 forms a useful quadrature demodulator 300. Each analog switch chooses between the input signal and an inverted copy of the input signal, effecting a gain of 1 or −1 respectively, which is functionally equivalent to the product detectors of the original Costas loop. The low pass filters 322 and 332 are designed to trade off the selectivity of the circuit against the lock time and range of frequencies that circuit can lock to.

In a preferred embodiment, the rectangular to polar conversion is performed by first digitizing the I-leg 320 and Q-leg 330 signals and computing angular coordinate θ(t) numerically within a microcontroller, such as microcontroller 800 shown in FIG. 8. The same microcontroller realizes the digital loop filter 342 within software instructions, and includes suitable timer/counter hardware and a stable clock source (e.g. ceramic resonator or crystal) that produces both the in-phase and quadrature reference square waves.

The inventor has recognized certain limitations with this first Wilson Filter embodiment. The gain of each inverting amplifier must be very accurate (on the order of 0.1%) and each inverting amplifier must have a response time fast enough to not introduce any local phase error. When phase-locked, the Q-leg output signal is driven to zero, but analog to digital conversion quantization affects the accuracy to which the Q-leg output signal can be measured. For example, when the Q-leg output signal is measured to one part in thousand, (i.e. with a 10-bit converter), then one least significant bit (LSB) corresponds to about 0.11°, or 5 μsec. A relatively high quantization error may make the loop wander a bit (e.g. dither), but it will remain 'stable' in the sense of a PLL meaning that it remains locked.

Refer now to FIG. 4, which shows a second and preferred embodiment of the Wilson Filter 40 that includes switched analog low pass filters. With reference back to FIG. 3, and considering the I-leg signal path, the single low pass filter 322 is replaced with the combination of a positive side low pass filter 422 and a negative side low pass filter 423 and the I-leg inverting unity gain amplifier 324 is realized as a digital multiply-by-negative-one function 424 and relocated downstream of the analog switch 321. The outputs of the I-leg positive side low pass filter 422 and the I-leg negative side low pass filter 423, after −1 multiplication, are recombined by a digital I-leg summation function 426.

Within the Q-leg signal path, the single low pass filter 332 is replaced with the combination of a positive side low pass filter 432 and a negative side low pass filter 433 and the I-leg inverting unity gain amplifier 334 is realized as a digital multiply-by-negative-one 434 function and relocated downstream of the analog switch 331. The outputs of the Q-leg positive side low pass filter 432 and the Q-leg negative side low pass filter 433, after −1 multiplication, are recombined by a digital Q-leg summation 436 function.

Within the feedback leg signal path, the digital oscillator 343 is replaced with the combination of a counter 441 and a state machine 442 where the state machine produces multiple in-phase and quadrature control signals.

Once the Wilson filter loop is locked, such as when the angular coordinate θ(t) 345 remains near zero for a few cycles and the magnitude coordinate r(t) 346 (shown in FIG. 12), also computed by the rectangular to polar converter 341, is above some predetermined minimum value, then the phase and period of the noisy AC line 13 (approximating AC fundamental 11) are known. It can be appreciated that the average absolute voltage of the incoming noisy AC line 13 is the magnitude coordinate r(t) 346 available from the rectangular to polar converter. It can also be appreciated that such knowledge of the period, phase, and line voltage of the AC line in conjunction with desired output power level is informative in computing the proper phase angle control schedule to control an electronic switching element within a lamp dimmer.

FIG. 5 shows certain additional details for the mixer/low pass filter sections, and more specifically, the I-leg of the Wilson Filter embodiment illustrated in FIG. 4. It is important to note that these additional details are limited to hardware components and that the necessary digital functions associated with FIG. 4 are assumed to be enabled on a processing element that is not explicitly shown in FIG. 5 and also that the details for the Q-leg are similar. As described above for the I-leg, the attenuated AC line signal enters the analog switch 321 after exiting the fixed attenuator 31. In this embodiment, the I-leg positive side low pass filter 422 is an RC network formed from a time shared resistor R2 in combination with a positive side capacitor C1, and the I-leg negative side low pass filter 423 is an RC network formed from the same time shared resistor R2 in combination with a negative side capacitor C2. The I-leg analog switch 321 determines whether the shared I-leg resistor is forming part of the I-leg positive side low pass filter or part of the I-leg negative side low pass filter at a particular moment in time. The time constant of such low pass filters is R2*(C1+C2), typically 200 milliseconds, making the 3 dB bandwidth of the circuit 10 radians/second, or about 1.6 Hz. This has proven to sufficient to allow a 5 Hz lock-in range for a 50/60 Hz application such as a lamp dimmer circuit.

In this embodiment, the I-leg analog switch 321 is a double pole single-throw (DPST) switch that is further formed from two single pole single-throw (SPST), such as for example, CMOS analog switches S1 and S2. Those skilled in the art will realize that the CMOS analog switches S1 and S2 effectively act to multiply the incoming attenuated AC line signal by a periodic square wave from the state machine 442 (e.g. by +1 or −1). Note that unlike a conventional four quadrant analog multiplier that might be found in the prior art; the CMOS analog switch does not introduce any significant voltage offset error. The output of the mixer stage is the difference voltage between the I-leg positive side capacitor C1 and the I-leg negative side capacitor C2.

In a preferred embodiment, the voltage difference is computed in a microcontroller after digitizing the two analog voltages. A preferred microcontroller incorporates certain auxiliary hardware including a multiplexer 501 and a shared analog to digital converter (ADC) A5. Advantageously, the use of single shared ADC A5 in combination with a multiplexer 501 produces less error than using separate ADCs, and also matches the ADC configuration typically present in certain commercially available microcontrollers. Since typically the capacitors need to be read only once per cycle, and if a given capacitor is read when the switch is open, this circuit also provides a sample and hold (S/H) function.

Refer now to FIG. 6. The fixed attenuator 31 reduces the AC line voltage to a value that can be accommodated by the remaining circuitry using a first voltage divider resistor R1 and a second voltage divider resistor R4.

In one embodiment of the present invention, a DC offset voltage source (V1) 311 is used here to allow analog to digital conversion using a single unipolar power supply, such as DC power supply 85, as shown in FIG. 8. In this embodiment, a third voltage divider resistor R5 is between the offset voltage source 311 and a junction formed between the first R1 and second R4 voltage divider resistors.

Refer now to FIG. 7 which certain timing signals applicable to the various

Wilson Filter embodiments. The AC fundamental 11, known in the prior art, is shown along with two synthesized square wave signals of the present invention. The first, an in-phase (I-channel) 14 signal, is substantially in-phase with, and has substantially the same frequency as the AC fundamental 11. The second, a quadrature (Q-channel) 15 signal is substantially phase shifted by 90° from, and has substantially the same frequency as the AC fundamental 11.

The I-channel 14 synthesized square wave can be further described as having a rising edge 141 that is substantially coincident with a positive trending zero crossing 111 (e.g. 0°), of AC fundamental 11, and a falling edge 142 that is substantially coincident with a positive trending zero crossing 112 (e.g. 180°), of AC fundamental 11.

The Q-channel 15 synthesized square wave can be further described as having a rising edge 151 that is substantially coincident with a positive peak 113 (e.g. 90°), of AC fundamental 11, and a falling edge 152 that is substantially coincident with a negative peak 114 (e.g. 270°), of AC fundamental 11.

Now refer to FIG. 8, which depicts a three wire phase controlled lighting dimmer 80 incorporating the Wilson Filter shown in FIG. 4. The lighting dimmer 80, such as a wall-mounted dimmer, is connected between the AC source 'hot' (H) input 81, AC source 'neutral' (N) input 82, and the 'dimmer hot' (DH) output 83, in a well known fashion. The load, not shown, is wired in series with a control circuit 84 that includes a controllably conductive device, such as a MOSFET or a triac, which receives gate control signals on a control electrode from conduction angle control logic 804 that may be implemented as software running within a microcontroller 800. The dimming level 805, assuming voltage compensation is off, is expressed as 0 through 100%. In one embodiment dimming level 805 is internally represented as a 16-bit number from 0x0000 through 0xFFFF. A table specific to a particular lighting load, such as a fluorescent lamp, is used to compensate the dimming level 805 to effect a linear light output. The compensated dimming level is multiplied by the measured period to compute the desired 'on' time of the switched device. The AC source voltage is also connected to a DC power supply 85, which provides a low level DC voltage (e.g. 5 VDC) to power the dimmer 80 internal electronics.

The AC voltage, such as 115 VAC (rms) present between 'hot' 81 and 'neutral' 82 is wired across a voltage divider made up of resistors R1 and R4 so that the voltage present at junction point 86 is suitable for typical analog to digital conversion circuitry (e.g. +/−2.5 VDC). The voltage at the junction point 86 is routed to two sampling channels that are designated as the 'I-leg' and 'Q-leg' respectively. In one embodiment of the present invention suitable for 115 volts alternating current (VAC) residential use, R1 is a 1.0 megohm (MΩ) resistor and R4 is a 12 kilohm (kΩ) resistor.

For the I-leg, the voltage at junction 86 is first routed through the shared I-leg resistor R2 and then routed through either a positive side selector switch S1 to charge a positive side capacitor C1 or through a negative side selector switch S2 to charge a negative side capacitor C2. The selector switches S1 and S2 are switched in accordance with the I-channel square wave signal 14, shown in FIG. 7, such that when the I-channel signal is 'high', the junction 86 voltage is routed to the positive side capacitor C1 and when the I-channel signal is 'low', the junction 86 voltage is routed to the negative side capacitor C2. The corresponding control signals, described below, are generated by the state machine 442 that may be implemented as software running within microcontroller 800. In one embodiment of the present invention suitable for 115 volts alternating current (VAC) residential use, R2 and R3 are each 1.0 megohm (MΩ) resistors and C1-C4 are each 0.1 microfarad (µF) capacitors.

For the Q-leg, the voltage at junction 86, is first routed through shared Q-leg resistor R3 and then routed through either a positive side selector switch S3 to charge a positive side capacitor C3 or through a negative side selector switch S4 to charge a negative side capacitor C4. The selector switches S3 and S4 are switched in accordance with the Q-channel square wave signal 15, shown in FIG. 7, such that when the Q-channel signal is 'high', the junction 86 voltage is routed to the positive side capacitor C3 and when the Q-channel signal is 'low', the junction 86 voltage is routed to the negative side capacitor C4. The corresponding control signals, described below, are generated by a state machine 442 that may be implemented as software running within microcontroller 800.

The state machine 442 generates output signals as a function of the counter 441 input. In one embodiment, the state machine 442 is a lookup table implemented in solid state memory, within microcontroller 800, where the memory address location corresponds to a present counter value and the output signals correspond to memory contents at that location. Those skilled in the art will recognize that the size of such a lookup table can be kept small by mapping each memory location in the table to a range of counter values instead of having a one to one correspondence. The inventor has discovered that a fractional N counter running at 1 to 2 MHz with a 4 state lookup table has provided satisfactory results. In an alternative embodiment, the state machine 442 is implemented as object code running on microcontroller 800 where such object code results from the compilation of a high level computer language, such as a 'switch' statement in 'C'.

In the feedback leg, a rectangular to polar converter 341 module accepts the summation 426 of the first and second I-leg RC filters as a first rectangular (x) coordinate and the summation 436 of the first and second Q-leg RC filters as a second rectangular (y) coordinate and computes the polar angular θ(t) coordinate. The digital loop filter 342 module accepts the polar angular θ(t) coordinate and a modulus 802 that controls a resetting of the counter 441. The counter 441 module increments in response to a clock 801, such as a clock internal to microcontroller 800. The state machine 442 decodes the count signal to produce the multiple I-leg and Q-leg control signals. Advantageously, using a clock 801 to drive a counter 441, which is then decoded by a state machine 442 to generate control signals, can operationally replicate the frequency of a digital controlled oscillator (DCO), familiar to those skilled in the art. Such a DCO is functionally limited by the clock 801 frequency and bit-width of the counter 441. It is highly desirable to generate the output waveforms independent of any interrupt service routine, such as from the counter 441 directly to a state machine 442 in order to avoid random skewing error.

The conduction angle control logic 804 also accepts the count signal from counter 441. The conduction angle control logic 804 generates an output signal to control circuit 84 such that the AC 'hot' H input 81 of dimmer 80 is conductively connected to the dimmer 'hot' DH output 83 of dimmer 80 for a certain portion of AC fundamental 11.

It is a feature of the present invention that the conduction angle control logic 804 responds to an input count from counter 441 and not to an actual zero crossing of either the AC fundamental 11 or the noisy AC line 13. In one embodiment, the conduction angle control logic 804 is a lookup table implemented in solid state memory, within microcontroller 800, where the memory address location corresponds to a present counter value and the output signal to the control circuit 84 corresponds to memory contents at that location. In an alternative embodiment, the conduction angle control logic 804 is object code running on microcontroller 800 where such object code results from the compilation of a high level computer language, such as a 'switch' statement in 'C'. It is even contemplated that the conduction angle control logic 804 and the state machine 442 can be combined into a single operative entity.

Those skilled in the art will recognize that certain design choices will be made when implementing the present invention, where the exact nature of the counter 441, state machine 442, and conduction angle control logic 804 depends on the type of hardware available on the particular type microcontroller 800 selected. In one embodiment, the counter 441 is a free-running counter with several compare registers, wherein internal software updates the compare registers to schedule the next event, such as when to open and close the switches S1-S4 or when to turn on or turn off the control circuit 84.

In one embodiment, the clock 801 has an operational frequency of 2 megahertz (MHz) and the counter 441 is 16 bits wide. With a 16-bit counter, 2 MHz is a practical clock frequency, but also introduces a 500 nanosecond (ns) quantization error. For example, 2 MHz/60 hz=33,333.33, which would result in a default modulus 802 value of 33,333 and would therefore cause a 'phase-slip' of 0.33*500 ns on each cycle. Therefore in this embodiment, a fractional technique is employed to make every third counter cycle (e.g. modulus 802 value) equal 33,334. Although this introduces about ½ clock tick of jitter in the output, the loop low pass filter will average that jitter out. 8 bits of fractional resolution has proven to provide suitable results.

The inventor has discovered that, in one embodiment that was reduced to actual practice, the accuracy of the recovered phase was not measurably affected by noise in the input waveform. The main source of error in this particular embodiment was quantization error in a 10-bit ADC converter which results in approximately a 5 μsec accuracy limitation that has proven to be quite adequate for lamp dimming applications. The digital filter (e.g. low pass) filter 342 averages a number of ADC readings, and the effects of the quantization error are actually somewhat diminished (e.g. accuracy is slightly better than 5 μsec). It is contemplated that the use of a 12-bit ADC in a future embodiment will even further improve the accuracy.

Refer now to FIG. 9 and continue to refer to FIG. 8. Certain output signals from state machine 442 are used to rout the voltage at junction 86 to the various capacitors C1-C4 by switching the on-off states of the selector switches S1-S4. Other output signals from state machine 422 are used to convert the voltage values on the various capacitors C1-C4 from analog to digital format by toggling a 'read' enable signal of each of four analog to digital converters A1, A2, A3, and A4. In certain embodiments, these four analog to digital converters A1-A4 are unipolar 0 to +5 VDC analog to digital converters that function as +/−2.5 VDC analog to digital converters by offsetting the input voltage using techniques known to those skilled in the art. In other embodiment, these four analog to digital converters A1-A4 are unipolar 0 to +3.3 VDC analog to digital converters. In even other embodiments, these four analog to digital converters A1-A4 may be replaced with a single multiplexed analog to digital converter A5 using techniques known to those skilled in the art.

Advantageously, one feature of the present invention is that the capacitors C1-C4 act as sample and hold circuits since each corresponding selector switch S1-S4 is open when a particular capacitor is read. This allows for considerable latitude in selecting the 'read enable' timing of the analog to digital converters A1-A4 to remove latency errors that might otherwise be introduced by variable interrupts at the microcontroller 800.

A first control signal 161 of state machine 442 controls the I-leg positive side selector switch S1 so that the switch S1 is closed (e.g. 'on') upon the rising edge 141 of the I-channel signal 14 and opened (e.g. 'off') upon the falling edge 142 of the I-channel signal 14. A second control signal 162 of state machine 442 controls the I-leg negative side selector switch S2 so that the switch S2 is closed (e.g. 'on') upon the falling edge 142 of the I-channel signal 14 and opened (e.g. 'off') upon the rising edge 141 of the I-channel signal 14.

A third control signal 163 of state machine 442 controls the Q-leg positive side selector switch S3 so that the switch S3 is closed (e.g. 'on') upon the rising edge 151 of the Q-channel signal 15 and opened (e.g. 'off') upon the falling edge 152 of the Q-channel signal 15. A fourth control signal 164 of state machine 442 controls the Q-leg negative side selector switch S4 so that the switch S4 is closed (e.g. 'on') upon the falling edge 152 of the Q-channel signal 15 and opened (e.g. 'off') upon the rising edge 151 of the Q-channel signal 15.

A fifth control signal 171 of state machine 442 toggles a 'read' enable of the I-leg positive side analog to digital converter (ADC) A1. According to the present invention, this I-leg positive side 'read' enable signal 171 may occur anywhere during a time period when the I-leg positive side selector switch S1 is open. A sixth control signal 172 of state machine 442 toggles a 'read' enable of the I-leg negative side analog to digital converter (ADC) A2. According to the present invention, this I-leg negative side 'read' enable signal 172 may occur anywhere during a time period when the I-leg negative side selector switch S2 is open.

A seventh control signal 173 of state machine 442 toggles a 'read' enable of the Q-leg positive side analog to digital converter (ADC) A3. According to the present invention, this Q-leg positive side 'read' enable signal 173 may occur anywhere during a time period when the Q-leg positive side selector switch S3 is open. An eighth control signal 174 of state machine 442 toggles a 'read' enable of the Q-leg negative side analog to digital converter (ADC) A4. According to the present invention, this Q-leg negative side 'read' enable signal 174 may occur anywhere during a time period when the Q-leg negative side selector switch S4 is open.

Refer now to FIG. 10 and continue to refer to FIG. 8. The noisy AC line 13 signal is shown slightly out of phase with the I-channel signal 14 as may be expected since the clock 801 that increments counter 441 is not synchronized with either the AC fundamental 11 or the noisy AC line 13. The I-leg positive side capacitor C1 charges while the I-channel signal 14 is 'high' and the accumulated voltage on the capacitor C1 is converted into a digital value while the I-channel signal 14 is 'low'. For the non-synchronized noisy AC line 13 signal, the I-leg positive side capacitor C1 increases charge when the noisy AC line 13 voltage level is positive, as represented by a first I-area 61, and decreases charge when the noisy AC line 13 voltage level is negative, as represented by a second I-area 62. The I-leg negative side capacitor C2 charges while the I-channel signal 14 is 'low' and the accumulated voltage on the capacitor C2 is converted into a digital value while the I-channel signal 14 is 'high'. For the non-synchronized noisy AC line 13 signal, the I-leg negative side capacitor C2 increases charge when the noisy AC line 13 voltage level is positive, as represented by a third I-area 63, and decreases charge when the noisy AC line 13 voltage level is negative, as represented by a fourth I-area 64.

The polarities of the I-leg positive side ADC A1 and the I-leg negative side ADC A2 are opposite with respect to one another and the RC time constants (e.g. R2C1 and R2C2) are greater that the period of the noisy AC line 13. The I-leg positive side voltage digital value is summed with the I-leg negative side voltage digital value at I-leg summation 424 which may be implemented as software running within microcontroller 800. In one embodiment of the present invention suitable for 115 volts alternating current (VAC) residential use, these time constants are each 100 milliseconds (msec) while the period of the AC line is 16.6 msec (e.g. 60 Hz). Those skilled in the art will recognize, for this residential embodiment, that the effective RC time constant with respect to each capacitor C1-C4 is 200 milliseconds because its corresponding selector switch S1-S4 is 'on' for only 50% of the time. This 200 milliseconds is more than 10 times the line frequency (e.g. 60 Hz or 16.6 milliseconds), allowing the resultant RC circuit to approximate an integrator that measures the area under the curve, such as noisy AC line 13, when one of the selector switches is 'on'.

Refer now to FIG. 11 and continue to refer to FIG. 8. The noisy AC line 13 is shown slightly out of phase with the Q-channel signal 15 as may be expected since the clock 901 that increments counter 441 is not synchronized with either the AC fundamental 11 or the noisy AC line 13. The Q-leg positive side capacitor C3 charges while the Q-channel signal 15 is 'high' and the accumulated voltage on the capacitor C3 is converted into a digital value while the Q-channel signal 15 is 'low'. For the non-synchronized noisy AC line 13, the Q-leg positive side capacitor C3 increases charge when the noisy AC line 13 voltage level is positive, as represented by a first Q-area 71, and decreases charge when the noisy AC line 13 voltage level is negative, as represented by a second Q-area 72. The Q-leg negative side capacitor C4 charges while the Q-channel signal 15 is 'low' and the accumulated voltage on the capacitor C4 is converted into a digital value while the Q-channel signal 15 is 'high'. For the non-synchronized noisy AC line 13, the Q-leg negative side capacitor C4 increases charge when the noisy AC line 13 voltage level is positive, as represented by a third Q-area 73, and decreases charge when the noisy AC line 13 voltage level is negative, as represented by a fourth Q-area 74.

The polarities of the Q-leg positive side ADC A3 and the Q-leg negative side ADC A4 are opposite with respect to one another and the RC time constants (e.g. R3C3 and R3C4) are greater that the period of the noisy AC line 13. The Q-leg positive side voltage digital value is summed with the Q-leg negative side voltage digital value at Q-leg summation 434 which may be implemented as software running within microcontroller 800. In one embodiment of the present invention suitable for 115 volts alternating current (VAC) residential use, these time constants are each 100 milliseconds (msec) while the period of the AC line is 16.6 msec (e.g. 60 Hz).

Refer now to FIG. 12 and continue to refer to FIG. 8. The I-leg summation 424 produces an x-coordinate representing an I-leg $1(t)$ filter output 225. The Q-leg summation 434 produces a y-coordinate representing a Q-leg Q(t) filter output 235. A rectangular to polar converter 341 accepts, as inputs, the x-coordinate and the y-coordinate and produces, as outputs, a magnitude r(t) coordinate 346 representing an AC voltage magnitude and an angular $\theta(t)$ coordinate 345 representing an AC voltage phase shift with respect to the I-channel signal 14. A digital loop filter 342 accepts, as an input, angular $\theta(t)$ coordinate 345 and produces, as an output, a counter modulus 802. This modulus 802 is used to control counter 441, such as for example by setting an internal reset value. In certain embodiments of the present invention, the rectangular to polar converter 341, the digital loop filter 342 and the modulus 802 are implemented as software running within microcontroller 800.

Microcontroller 800 therefore functions as a portion of a phase locked loop (PLL) where the modulus 802 is manipulated in a manner so as to minimize the resultant AC voltage phase shift with respect to the I-channel 14. The forward path of such a control loop is the counter 441 through the state machine 442 providing control signals that turn selector switches S1-S4 on and off. The feedback path of such a control loop is accumulated voltages on the various capacitors C1-C4 which are processed by analog to digital converters A1-A4, summers 424 and 434, a rectangular to polar converter 341, and a digital loop filter 342. Those skilled in the art will recognize that digital loop filter 342 functions as a proportional/integral filter as would be expected for a loop of this type.

Once locked, the I-leg signal I(t) is precisely in phase with the AC line, and the Q-leg signal Q(t) is precisely 90 degrees out of phase. The average voltage level of the Q-leg signal Q(t) is 0, and the average voltage on I-leg signal I(t) is proportional to the absolute value of the AC line. Since both I(t) and Q(t) are therefore known values, it's possible to calculate the phase error independent of the line voltage, which in turn allows the phase locked loop (PLL) to be tuned for faster lock time.

In parallel to the control loop described above, the output of counter 441 is used by the conduction angle control logic 804 in conjunction with a selected dimming level 805 to produce an input for control circuit 84. An example dimming load, set at a low dimming level, might be on for 8.0 msec after the I-channel rising edge 141, which generally corresponds to a positive trending zero crossing 111 of AC fundamental 11.

One alternate embodiment includes another "T-channel" synthesized square wave which is a third harmonic of, and in phase with the Q-channel described above. This T-channel can be further described as having rising edges that are substantially coincident with 90°, 210°, and 330° of the AC fundamental 11 respectively and falling edges that are substantially coincident with 150°, 270°, and 30° of the AC fundamental respectively. Measuring the third harmonic by processing the T-channel estimates the asymmetry of the noisy AC line 13 signal. Those skilled in the art will recognize that this asymmetry causes an error in the power output measurement, which can therefore be corrected.

Refer back to FIG. 1. The T-channel measures out-of-phase third harmonic content. The inventor has noted that an interfering signal of this type causes an asymmetry in the AC line voltage wave form, such as AC fundamental 11. In other words, an asymmetric AC waveform will contain out of phase third harmonic content. This asymmetry can cause a positive trending zero-crossing 131 of the noisy AC line 13 to be different that the positive trending zero crossing 111 of the AC fundamental 11 by several hundred microseconds in extreme cases. We have discovered that measuring the amplitude of the out of phase third harmonic relative to the in phase fundamental allows an additional correction factor to be applied.

Refer now to FIG. 13, which shows a third embodiment of the Wilson Filter that includes a delta-sigma modulator 911. Advantageously, this moves the mixer and low pass filter functionality into the digital domain. With reference back to FIG. 2 and considering the I-leg signal path, the product detector 221 is replaced with an exclusive-or (XOR) gate 921 and the low pass filter 222 is implemented as a digital low pass filter 922. Similarly, for the Q-leg signal path, the product detector 231 is replaced with an exclusive-or (XOR) gate 931 and the low pass filter 232 is implemented as a digital low pass filter 932.

Quadrature mixing is primarily accomplished via the digital I-leg XOR gate 921 and the digital Q-leg XOR gate 931, which each function as rudimentary gated counters that measure the number of binary '1's per cycle, followed by corresponding I-leg 922 and Q-leg 932 first order digital low pass filters that each have a corner frequency that is the same as the equivalent analog low pass filters 222 and 232, such as those shown in FIG. 2. It will be apparent to those skilled in the art that, arithmetically, this second Wilson Filter embodiment produces the same results as the first Wilson Filter embodiment. However, at physical reduction to practice using typical commercially available components and where the first-order delta-sigma modulator 911 converts the noisy AC line 13 input into a bit stream at approximately 1 MHz; the combination of the delta-sigma converter 911 and digital low pass filters 922 and 932 will have a much greater accuracy than a typical 10-bit ADC given the high ratio between the quadrature modulator and output sample rate.

LIST OF ACRONYMS USED IN THE DETAILED DESCRIPTION OF THE INVENTION

The following is a list of the acronyms used in the specification in alphabetical order.
AC alternating current
ADC analog to digital converter
CMOS complementary metal oxide semiconductor
dB decibel
DC direct current
DCO digitally controlled oscillator
DH dimmer output line 'hot'
DPST double pole single-throw (switch)
FET field effect transistor
H AC line 'hot'
Hz hertz
I in phase
IGBT isolated gate bipolar transistor
kHz kilohertz
k$\Omega$ kilohm
LSB least significant bit
MHz megahertz
MOSFET metal oxide semiconductor field effect transistor
msec millisecond
Mux multiplexer
M$\Omega$ megohm
NCO numerically controlled oscillator
H AC line 'neutral'
ns nanosecond
PLL phase locked loop
Q quadrature
r radial (magnitude) coordinate
RC resistor-capacitor (time constant)
RF radio frequency
rms root-mean-squared (AC voltage measurement)
S/H sample and hold
SCR silicon controlled rectifier
t time (as in function of)
V voltage
VAC volts, alternating current
VDC volts, direct current
x horizontal coordinate (rectangular coordinate system)
XOR exclusive or
y vertical coordinate (rectangular coordinate system)
$\theta$ angular coordinate
$\Sigma$ summation
$\mu$F microfarad
$\mu$sec microsecond Alternate Embodiments Alternate embodiments may be devised without departing from the spirit or the scope of the invention.

What is claimed is:

1. A system for recovering the phase and amplitude of an AC power line signal comprising:
    (a) a phase detector having an output linearly proportional to phase error and independent of line voltage and further comprising
        (i) a quadrature demodulator (300) having a digital in-phase (I) channel (320) and a quadrature (Q) channel (330),
        (ii) an I-leg low pass filter (322),
        (iii) a Q-leg low pass filter (332), and
        (iv) a rectangular to polar converter (341);
    (b) a digital loop filter (342); and
    (c) a controllable digital oscillator (343) configured to produce in phase and quadrature reference signals for the quadrature demodulator; wherein
    (d) the quadrature demodulator, the I-leg low pass filter, and the Q-leg low pass filters are each implemented as analog elements;
    (e) the rectangular to polar converter, the digital loop filter, and the controllable oscillator are each realized as functions of a programmable microcontroller (800);
    (f) the microcontroller is adapted to produce at least one phase angle fired signal for controlling power delivered to a load.

2. The phase controlled lighting dimmer according to claim 1 wherein:
    (a) a magnitude coordinate computed by the rectangular to polar converter output is adapted to further voltage compensate the at least one phase angle fired signal for controlling power delivered to a load.

3. The system of claim 1 wherein the quadrature demodulator further comprises:
    (a) a delta sigma modulator (911);
    (b) an I-leg XOR circuit (921); and
    (c) a Q-leg XOR circuit (931); and wherein (d) the I-leg low pass filter and the Q-leg low pass filter are each realized as functions of a programmable microcontroller.

4. The system of claim 3 wherein the microcontroller is augmented with a programmable logic device.

5. A system for recovering the phase and amplitude of an AC power line signal comprising:
    (a) a phase detector having an output linearly proportional to phase error and independent of line voltage and further comprising
        (i) an I-leg mixer implemented using a first analog switch (321),
        (ii) an I-leg positive low pass filter (422) configured to produce an output,
        (iii) an I-leg negative low pass filter (423) configured to produce an output,
        (iv) a Q-leg mixer implemented using a second analog switch (331),
        (v) a Q-leg positive low pass filter (432) configured to produce an output,
        (vi) a Q-leg negative low pass filter (433) configured to produce an output,
        (vii) a rectangular to polar converter configured to accept, as inputs,
            (A) the computed difference between the I-leg positive low pass filter output and the I-leg negative low pass filter output, and
            (B) the computed difference between the Q-leg positive low pass filter output and the Q-leg negative low pass filter output;
    (b) a digital loop filter;
    (c) a counter (441); and
    (d) a state machine (442) configured to produce in phase and quadrature control signals for the I-leg and Q-leg analog switches.

6. The system of claim 5 further comprising:
    (a) a fixed attenuator (31) that further comprises
        (i) a first voltage divider resistor (R1), and
        (ii) a second voltage divider resistor (R4).

7. The system of claim 6 wherein said fixed attenuator further comprises:
    (a) an offset voltage source (V1); and
    (b) a third voltage divider resistor (R5) disposed between the offset voltage source and a junction formed between the first and second voltage divider resistors.

8. The system of claim 5 wherein:
    (a) the I-leg positive low pass filter is an RC network that further comprises
        (i) a shared I-leg resistor (R2) that is common to the I-leg negative low pass filter, and
        (ii) an I-leg positive side capacitor (C1);
    (b) the I-leg negative low pass filter is an RC network that further comprises
        (i) the shared I-leg resistor, and
        (ii) an I-leg negative side capacitor (C2); and wherein
    (c) the I-leg analog switch is configured to switchably determine
        (i) when the shared I-leg resistor is forming part of the I-leg positive low pass filter, and
        (ii) when the shared I-leg resistor is forming part of the I-leg negative low pass filter and the I-leg negative low pass filter.

9. The system of claim 8 further comprising:
(a) a multiplexer (501); and
(b) a shared analog to digital converter (A5).

10. A load control system for controlling power delivered from an AC line to a load, wherein the AC line has a fundamental (11) frequency, said load control system comprising:
    (a) a control circuit (84) including a controllably conductive device;
    (b) conduction angle control logic (804) adapted to produce a control signal to the control circuit, wherein said control signal is produced in response to a selected dimming level (805), an internal clock (801), and a modulus (802);
    (c) an in-phase channel signal (14) having substantially the same frequency as and being substantially in phase with the fundamental frequency wherein said in-phase channel signal is produced in response to the internal clock and having two states;
    (d) a quadrature channel signal (15) having substantially the same frequency as and being substantially in quadrature with the fundamental frequency wherein said quadrature channel signal is produced in response to the internal clock and having two states;
    (e) an in-phase positive side capacitor connectably configured as part of a low pass filter during a first state of the in-phase channel signal and connectably configured for analog to digital conversion to a first in-phase value during a second state of said in-phase channel signal;
    (f) an in-phase negative side capacitor connectably configured as part of a low pass filter during the second state of the in-phase channel signal and connectably configured for analog to digital conversion to a second in-phase value during the first state of said in-phase channel signal;
    (g) a quadrature positive side capacitor connectably configured as part of a low pass filter during a first state of the quadrature channel signal and connectably configured for analog to digital conversion to a first quadrature value during a second state of said quadrature channel signal;
    (h) a quadrature negative side capacitor connectably configured as part of a low pass filter during the second state of the quadrature channel signal and connectably configured for analog to digital conversion to a second quadrature digital value during the first state of said quadrature channel signal;
    (i) a rectangular to polar converter configured to accept the difference of the first and second in-phase values as a first rectangular (x) coordinate and the difference of the first and second quadrature digital values as a second rectangular (y) coordinate and configured to produce therefrom a polar angular ($\theta$) coordinate; and
    (j) a digital loop filter configured to accept the polar angular ($\theta$) coordinate and configured to modify the modulus based on the value thereof.

11. The load control system according to claim 10 wherein the controllably conductive device is selected from the group consisting of: MOSFET, triac, silicon controlled rectifier, and isolated gate bipolar transistor.

12. The load control system according to claim 10 further comprising:
    (a) a DC power supply (85) adapted to power internal electronics.

13. The load control system according to claim 10 further comprising:
    (a) first and second voltage divider resistors adapted to reduce the AC line voltage level to a level suitable for analog to digital conversion circuitry.

14. The load control system according to claim 13 wherein:
(a) the first voltage divider resistor has a value of 1 megohm; and
(b) the second voltage divider resistor has a value of 12 kilohm.

15. The load control system according to claim 10 further comprising:
(a) an in-phase shared resistor switchably configured to
   (i) form an RC time constant with the in-phase positive side capacitor during the first state of the in-phase channel signal, and
   (ii) form an RC time constant with the in-phase negative side capacitor during the second state of the in-phase channel signal; and
(b) a quadrature shared resistor switchably configured to
   (i) form an RC time constant with the quadrature positive side capacitor during the first state of the quadrature channel signal, and
   (ii) form an RC time constant with the quadrature negative side capacitor during the second state of the quadrature channel signal.

16. The load control system according to claim 15 further comprising:
(a) an in-phase positive selector switch (S1) disposed between the in-phase shared resistor and the in-phase positive side capacitor;
(b) an in-phase negative selector switch (S2) disposed between the in-phase shared resistor and the in-phase negative side capacitor;
(c) a quadrature positive selector switch (S3) disposed between the quadrature shared resistor and the quadrature negative side capacitor; and
(d) a quadrature negative selector switch (S4) disposed between the quadrature shared resistor and the quadrature negative side capacitor.

17. The load control system according to claim 15 wherein:
(a) the in-phase shared resistor and the quadrature shared resistor each have a value of 1 megohm; and
(b) the in-phase positive side capacitor, the in-phase negative side capacitor, the quadrature positive side capacitor, and the quadrature negative side capacitor each have a value of 0.1 microfarad.

18. The load control system according to claim 10 further comprising:
(a) a first analog to digital converter (A1) adapted to convert a voltage present on the in-phase positive side capacitor to the first in-phase value;
(b) a second analog to digital converter (A2) adapted to convert a voltage present on the in-phase negative side capacitor to the second in-phase value;
(c) a third analog to digital converter (A3) adapted to convert a voltage present on the quadrature positive side capacitor to the first quadrature value; and
(d) a fourth analog to digital converter (A4) adapted to convert a voltage present on the quadrature negative side capacitor to the second quadrature value.

19. The load control system according to claim 18 wherein:
(a) the first analog to digital converter is a unipolar analog to digital converter;
(b) the second analog to digital converter is a unipolar analog to digital converter;
(c) the third analog to digital converter is a unipolar analog to digital converter; and
(d) the fourth analog to digital converter is a unipolar analog to digital converter.

20. The load control system according to claim 19 wherein:
(a) the first analog to digital converter is a unipolar 0 to +3.3 VDC analog to digital converter;
(b) the second analog to digital converter is a unipolar 0 to +3.3 VDC analog to digital converter;
(c) the third analog to digital converter is a unipolar 0 to +3.3 VDC analog to digital converter; and
(d) the fourth analog to digital converter is a unipolar 0 to +3.3 VDC analog to digital converter.

21. The load control system according to claim 10 further comprising:
(a) a multiplexed analog to digital converter adapted to
   (i) convert a voltage present on the in-phase positive side capacitor to the first in-phase value,
   (ii) convert a voltage present on the in-phase negative side capacitor to the second in-phase value,
   (iii) convert a voltage present on the quadrature positive side capacitor to the first quadrature value, and
   (iv) convert a voltage present on the quadrature negative side capacitor to the second quadrature value.

22. The load control system according to claim 10 further comprising:
(a) a counter (441) adapted to increment in response to the internal clock and reset in response to the modulus and to produce a count signal therefrom;
(b) a state machine (442) adapted to accept the count signal from the counter and to produce therefrom a plurality of in-phase channel control signals and a plurality of quadrature channel control signals; and
(c) wherein the conduction angle control logic is adapted to respond to the modulus by responding to the count signal from the counter.

23. The load control system according to claim 22 wherein:
(a) the internal clock has an operational frequency of 2 MHz; and
(b) the counter is 16 bits wide.

24. The load control system according to claim 22 wherein the state machine is a lookup table implemented in solid state memory.

25. The load control system according to claim 22 wherein the state machine is a lookup table implemented in solid state memory.

26. The load control system according to claim 22 wherein the state machine is emulated by object code running on a microcontroller.

27. The load control system according to claim 22 wherein the conduction angle control logic is a lookup table implemented in solid state memory.

28. The load control system according to claim 22 wherein the conduction angle control logic is object code running on a microcontroller.

29. The load control system according to claim 10 further comprising:
(a) a third harmonic quadrature channel signal having substantially the same frequency as and being substantially in quadrature with a third harmonic of the fundamental frequency wherein said third harmonic quadrature channel is produced in response to the internal clock and the modulus and having two states;
(b) a third harmonic quadrature high side charging capacitor configured to charge during a first state of the third harmonic quadrature channel signal and configured to be converted to a first third harmonic quadrature digital value during a second state of said third harmonic quadrature channel signal; and
(c) a third harmonic quadrature low side charging capacitor configured to charge during the second state of the third harmonic quadrature channel signal and configured to be converted to a second third harmonic quadrature digital value during the first state of said third harmonic quadrature channel signal.

30. A dimmer for controlling power delivered from an AC line to a load, wherein the AC line has a fundamental frequency, said dimmer comprising:
(a) a control circuit including a controllably conductive device;
(b) analog phase detector circuitry further comprising
  (i) a shared I-leg resistor;
  (ii) an I-leg analog switch configured to switchably determine
    (A) when the shared I-leg resistor is forming part of a first I-leg RC filter in combination with a first I-leg capacitor, and
    (B) when the shared I-leg resistor is forming part of a second I-leg RC filter in combination with a second I-leg capacitor
  (iii) a shared Q-leg resistor;
  (iv) a Q-leg analog switch configured to switchably determine
    (A) when the shared Q-leg resistor is forming part of a first Q-leg RC filter in combination with a first Q-leg capacitor, and
    (B) when the shared Q-leg resistor is forming part of a second Q-leg RC filter in combination with a second Q-leg capacitor,
(c) a microcontroller configured to execute a programmed sequence of instructions, said instructions further comprising
  (i) a rectangular to polar converter module configured to accept the difference of the first and second I-leg RC filters as a first rectangular (x) coordinate and the difference of the first and second Q-leg RC filters as a second rectangular (y) coordinate and configured to produce therefrom a polar angular ($\theta$) coordinate;
  (ii) a digital loop filter module configured to accept the polar angular ($\theta$) coordinate and to produce therefrom a modulus;
  (iii) a counter module adapted to increment in response to an internal clock and configured to accept the modulus and to produce therefrom a count signal;
  (iv) a state machine module configured to accept the count signal and to produce therefrom a plurality of I-leg and Q-leg control signals; and
  (v) a conduction angle control logic module to accept the count signal and to produce therefrom a control signal to the controllably conductive device.

31. A method for controlling power delivered from an AC line having a fundamental frequency to a load through a serially connected controllably conductive device, said method comprising the steps of:
(a) demodulating, in quadrature, a noisy AC line;
(b) producing an in-phase component signal and a quadrature component signal;
(c) computing an angular coordinate from the in-phase component signal and the quadrature component signal using a rectangular-to-polar conversion;
(d) closing a phase-locked-loop based on the angular coordinate by correcting an internal counter; and
(e) controlling the power delivered by gating a controllably conductive device in response to the internal counter.

32. The method according to claim 31 further comprising the steps of:
(a) computing a magnitude coordinate from the in-phase component signal and the quadrature component signal using the rectangular-to-polar conversion;
(b) compensating for voltage variations of the noisy AC line by altering the gating of the controllably conductive device in response to the magnitude coordinate.

* * * * *